United States Patent [19]
Gao

[11] Patent Number: 5,484,979
[45] Date of Patent: Jan. 16, 1996

[54] LASER SOLDERING PROCESS EMPLOYING AN ENERGY ABSORPTIVE COATING

[75] Inventor: Guilian Gao, Novi, Mich.

[73] Assignee: Ford Motor Company, Dearborn, Mich.

[21] Appl. No.: 139,663

[22] Filed: Oct. 22, 1993

[51] Int. Cl.$^6$ .................................................. B23K 26/00
[52] U.S. Cl. ............................... 219/121.64; 219/121.63
[58] Field of Search ........................... 219/121.6, 121.63, 219/121.64, 85.12, 121.12, 121.13, 85.13; 148/23

[56] References Cited

U.S. PATENT DOCUMENTS

| | | | |
|---|---|---|---|
| 4,733,039 | 3/1988 | Schnable et al. | 219/121.63 |
| 4,785,156 | 11/1988 | Benko et al. | 219/121.64 |
| 5,021,630 | 6/1991 | Benko et al. | 219/121.64 |
| 5,055,652 | 10/1991 | Jones et al. | 219/121.64 |
| 5,274,210 | 12/1993 | Freedman et al. | 219/121.63 |

*Primary Examiner*—Tu Hoang
*Attorney, Agent, or Firm*—Joseph W. Malleck; Roger L. May

[57] ABSTRACT

The invention provides an improved process of laser soldering employing an energy absorptive material as a protective coating in place of traditional flux agents. The invention also relates to a method of using an energy absorptive material as a protective coating in laser soldering processes.

20 Claims, 2 Drawing Sheets

LASER SOLDERING PROCESS EMPLOYING AN ENERGY ABSORPTIVE COATING

TECHNICAL FIELD

The present invention relates to an improved process of laser soldering which employs an energy absorptive material as a protective coating in place of a flux agent and to a method of using an energy absorptive material in a laser soldering process, the process and method being particularly useful in the manufacture of electronic devices, especially thick film products.

BACKGROUND ART

Laser soldering is widely used in the electronics industry when the assembly of printed circuits, electronic components, conductors and microelectronic devices requires the formation of a permanent joint between two or more metal parts or metallic surfaces. Solder as used herein is defined as a metal or metallic alloy which is melted to join two or more metallic parts or surfaces. The term "electronic device" will be used to refer to products produced by the electronics industry.

Prior art laser soldering processes typically involve the application of a solder paste or solder preform to at least one part having a metallic surface during the manufacturing process. If solder paste is used, sufficient heat is then applied to reflow or melt the solder paste. Ideally, this molten solder wets the metallic surfaces to be joined. The molten solder is then cooled to provide a solder preform or pad. The second part having a metallic surface is then positioned so as to be in contact with the solder. The steps of applying solder and reflowing it may be done as part of the manufacture of the electronic device or may be done separately. In the latter case, a solder preform or pad results which is supplied in a ready to use fashion. It is not necessary to reflow the solder preform. The second metal part is simply positioned thereon.

Thermal energy is directed at the junction of the two metallic parts and the solder pad or preform. A permanent joint results from the alteration of the structure and composition of the metallic surfaces and solder caused by the extremely high temperatures and intensity of the laser energy.

However, the presence of metal oxides, carbon compounds and other contaminants on the surface of the metal parts or metallized surfaces significantly impedes the formation of a metallurgically sound solder joint. Such contaminated metal surfaces cannot be wet by the molten solder. Metal oxides, whether on the metal surfaces or in the solder paste, are particularly detrimental to the production of solder joints with high metallurgical integrity. The quality of the solder joint is particularly important in the electronics industry where the joint must have sufficient integrity to hold the various electronic components in place and to pass electrical signals. Without metallurgically sound solder joints, the overall performance and reliability of electronic devices may be comprised by low quality or imperfect joints.

Traditionally, fluxes have been used to remove the metal oxides and metal oxide films from the metallic surfaces which must be wet by the molten solder. The formation of sound metallurgical joints have generally been obtainable only with the use of a flux capable of removing metal oxides from the metallic surfaces and inhibiting any subsequent oxidation of the cleaned metal surface. Additional benefits achieved with traditional fluxes included the removal of metal oxides in the molten solder and a resultant reduction in the surface tension of the molten solder and an enhanced flow. Also such agents have generally assisted in the transfer of heat to the joint during the actual soldering process.

Traditional fluxes commonly consist of an active agent dissolved or dispensed in a liquid carrier which evaporates in the soldering process. The function of the active agent is to reduce base metal oxides. Active agents may be organic or inorganic acids. Well known prior art fluxes are natural rosin based fluxes such as wood rosin or gum rosin, the major component of which is abietic acid. A typical prior art flux contains about 80% rosin.

Prior art laser soldering processes employ a variety of techniques to apply fluxes. They are generally brushed or sprayed when used in the manufacture of electronic assemblies. It is sometimes desirable for the flux to have a low viscosity so that it can readily flow into gaps of the electronic assemblies to encompass the entire surface. Alternatively, conventional rosin based fluxes may be incorporated within the center or core of solder wires.

However, several significant problems arise in the manufacture of electronic devices as a result of the use of traditional fluxes. After a solder joint is formed, a flux residue remains. Such residues generally consist of unreacted flux, carrier which is not evaporated, acid or salt deposits, and/or the removed metal oxides. These residues can be deleterious to the long term reliability of the electronic device if not removed. Unreacted flux or non-volatilized carrier can absorb water to become an ionic conductor which can result in electrical shorting and corrosion. The active portion of the unreacted flux can, over a period of time, corrode the soldered components and cause electrical faults. Furthermore, in traditional prior art soldering processes, the flux residue covers the entire assembly and is present not only on the surface, but also underneath specific components where inspection is difficult and the residue is hard to remove.

Steps to remove the unreacted flux and flux residue typically require the use of solvents in which the unreacted flux and residue are soluble. Typical cleaning solvents are the halogenated hydrocarbons such as chlorinated fluorocarbons. The use of such halogenated solvents is particularly non-desirable because of their deleterious environmental effects.

In addition to these problems, the post-soldering presence of unreacted flux and flux residues can cause significant problems with respect to subsequent manufacturing steps and the performance of other components in the electronic device.

For example, in many electronic and microelectronic devices, especially thick film products, a silicon based potting material or gel is applied to the device to protect the electrical circuitry from the negative effects of moisture. Potting is typically the last step in the manufacturing process. The presence of the flux material can inhibit the cure of the potting material and thus render the circuitry vulnerable to attack from water and moisture in the atmosphere. In particular, the partially cured potting material allows moisture to condense at the circuit board/gel interface. When the device is powered during operation, the condensed moisture induces high leakage current which can (1) interfere with the current operation and (2) cause failure through dendritic growth.

Finally, the application of heat to the flux can result in the volatilization of particular flux components which can have unpleasant odors and non-desirable environmental effects.

The problems attendant to the use of flux agents are exacerbated in laser soldering processes. By its very nature, laser soldering is incapable of providing a heat profile whereby the temperature of the solder joint is allowed to have a gradual or ramp increase and a corresponding gradual or ramp decrease. The heat profile for a laser soldered joint appears merely as a sharp spike, exhibiting neither a ramp increase or ramp decrease in temperature. As a result, even liquid fluxes known as "no clean fluxes" are unsuitable for use in laser soldering processes. Such no-clean fluxes depend on a heat profile produced during conventional soldering to volatilize or decompose most of the flux constituents so that little or no flux residues result.

Another problem associated with laser soldering is the deflection of some or all of the laser beam energy away from the joint to be soldered. This deflection is generally attributed to the natural reflectance of the metal or metallic parts. Although seen to some extent with all laser sources, it is particularly severe when the source generates long wavelengths.

Finally, the heat energy generated by the laser beam may not be conducted to all of the components of the desired solder joint. Alternatively, insufficient heat may conducted. Although the laser beam will generally only hit the top surface of the upper most part to be joined, sufficient heat must be conducted to the bottom metal part and the solder to effect the necessary structural changes therein. This is true regardless of whether the solder is in the form of a preform pad or is molten. If a pad is utilized, enough heat to reflow or melt the pad must also be supplied.

Prior art patents such as U.S. Pat. Nos. 4,092,182 and RE 30,696 to Arbib et al., disclose the use of a flux composition having at least one ester derived from a polyhydric alcohol and at least one saturated or unsaturated fatty acid or monocarboxylic mononuclear aromatic acid. The ester has a molecular weight of at least 300. The composition also has at least one additional constituent selected from (1) organic acids which are substantially soluble in the ester when in a molten condition, (2) flux activating agents, and (3) flux residue hardening agents. The ester is at least 25% by weight based on the total weight of the ester and the additional constituent. However, the laser soldering processes disclosed in the Arbib et al. patents result in the presence of the composition on other components of the electronic devices, such as resistors, thereby impeding and in some cases completely precluding effective laser trimming.

Those skilled in the art will appreciate that in the manufacture of thick film electronic devices, resistors are produced by printing resistor ink in the desired locations and then firing to cure the ink. Due to process variations, such resistors are almost always out of specified range or value. As a result, the resistors must be cut or trimmed by a laser beam to correct their value. Trimming cuts away excess cured resistor ink to produce the desired performance values. The trimming laser "sees" the contrast between the black resistor and the surrounding white border. The presence of the Arbib et al. compositions can impede machine vision, i.e. the "seeing" of the laser and can actually prevent the cutting away of the resistor ink because of their energy absorptive capabilities.

Although some resistors can be trimmed prior to the laser soldering process, others are used to compensate for any process variations. These resistors can only be trimmed as part of the final 'end of line' functional test. The end of line test serves as the final quality control check and ensures that the device operates as intended.

Accordingly, what is desired is a soldering process which eliminates the use of traditional fluxes and does not inhibit the cure or performance of silicon-based potting compounds or the trimming of the finished electronic device. The process must, however, produce solder joints which are metallurgically sound and which are without corrosive residues that would require post-solder cleaning.

It is thus an object of the invention to provide a process of laser soldering for use in manufacturing electronic devices which utilizes an energy absorptive coating in such a manner that the need for traditional fluxes is eliminated. The desired process should not impede subsequent manufacturing steps such as the use of silicon-based potting compounds and the final trimming of the electronic device.

It is a further object of the invention to provide a process of laser soldering which utilizes an energy absorptive coating upon at least one of two metal parts to be joined. The coating should protect against metal oxide formation on the surface of the first metal part and decrease the reflectivity of the first metal part while producing a solder joint which is free of residues requiring post solder cleaning.

SUMMARY OF THE INVENTION

The present invention broadly relates to a process of laser soldering a first and a second metal part to form a solder joint. The process consists of providing an energy absorptive coating upon the first metal part to form a coated first metal part, wherein the coating protects against metal oxide formation on the surface of the first metal part and decreases the reflectivity of the first metal part; providing a solder pad on the surface of the second metal part; juxtaposing the coated first metal part on the solder pad, wherein the coating imbues the characteristic of improved wetting and flow to the solder pad; and directing a sufficient quantity of laser energy to the coated first metal part so that the solder joint results between the first and the second metal part, wherein the laser energy is absorbed by the coating and transferred to the solder joint as heat energy and the solder joint is substantially without corrosive residues which would require post-solder cleaning.

Further, the present invention also relates to a method of using an energy absorptive material in a laser soldering process. The process consists of removing substantially all metal oxides from the surface of a first metal part so as to provide a clean first metal part; providing a coating upon the clean first metal part to form a coated first metal part, the coating comprising an energy absorptive material, wherein the coating protects against metal oxide formation on the surface of the first metal part and decreases the reflectivity of the first metal part; applying a solder pad to the surface of a second metal part; juxtaposing the coated first metal part and the solder pad, wherein the coating imbues the characteristic of improved wetting and flow to the solder pad; and directing a sufficient quantity of laser energy to the coated first metal part so that the solder joint results between the first metal part and the second metal part, wherein the laser energy is absorbed by the coating and transferred to the solder joint as heat energy and the solder joint is substantially without corrosive residues which would require post-solder cleaning.

DETAILED DESCRIPTION OF THE PREFERRED EMBODIMENT

The present invention addresses the deficiencies of the prior art by utilizing an energy absorptive material as a protective coating on at least one of two or more metal parts to be joined together. The process is particularly useful in the production of thick film electronic products. Those skilled in the art will appreciate that thick film electronic products are distinguishable from printed wire board products and encompass those electronic devices where the circuitry is printed on a ceramic surface.

Figure 1:
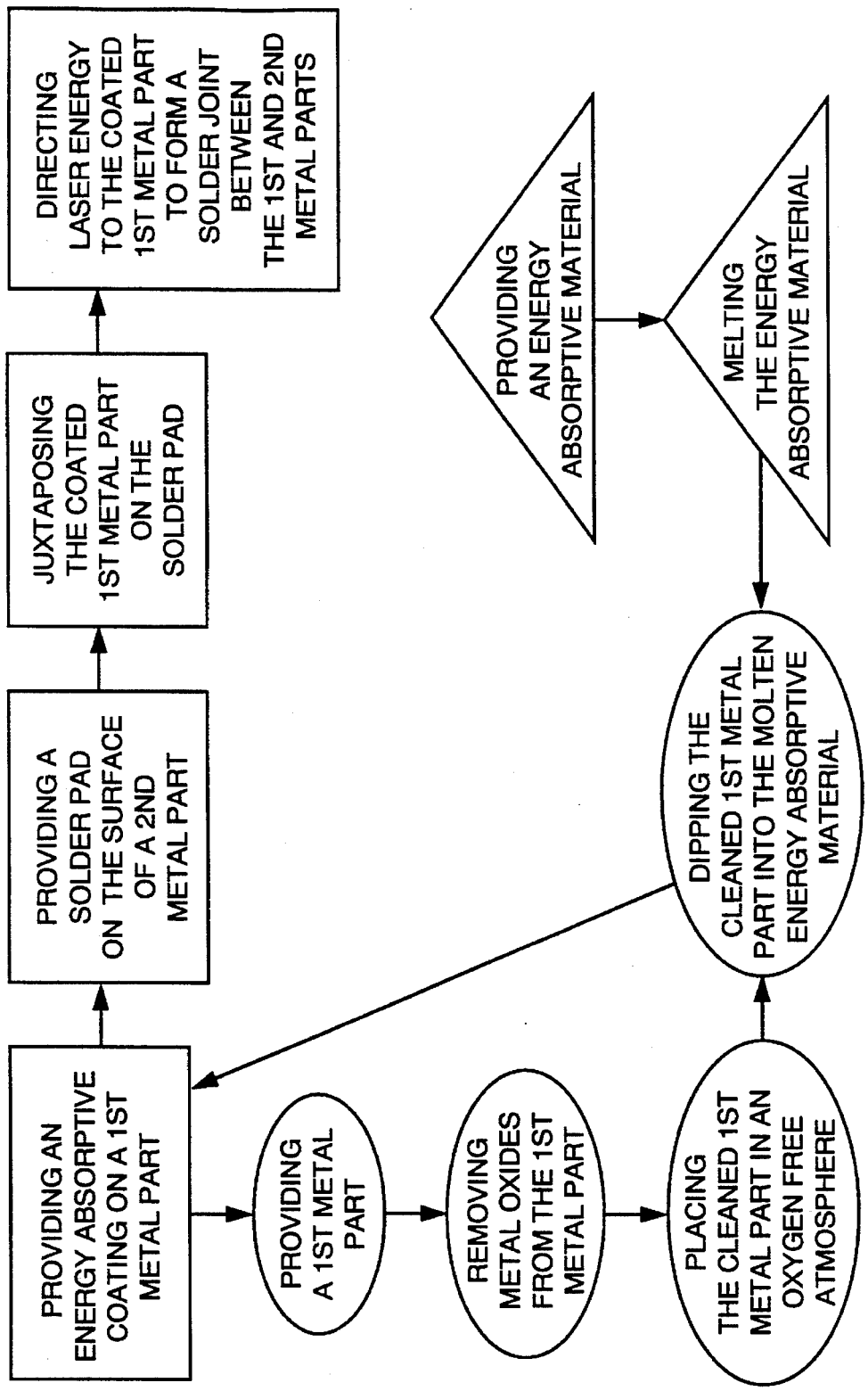
FIG. 1 is a flow chart detailing the steps of the invention.
Figure 2:
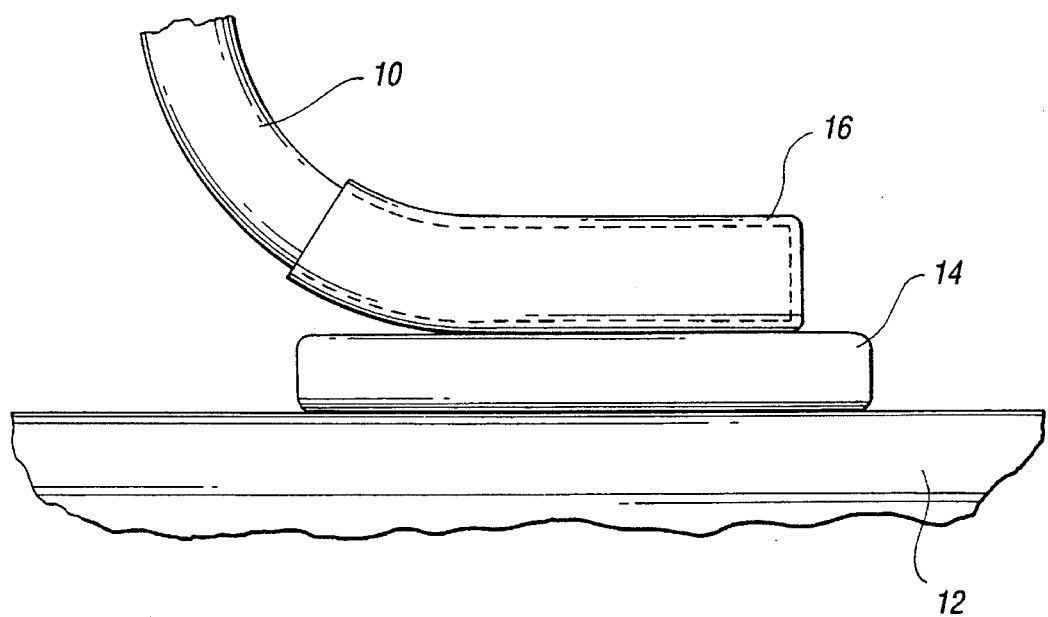
FIG. 2 is a side perspective of the solder joint of the invention prior to the addition of laser energy.

FIGS. 1 and 2 may be used to illustrate the instant invention. FIG. 1 is a flow chart detailing the steps of the invention discussed below. FIG. 2 is a side perspective of a solder joint prior to the addition of laser energy. Lead 10, coated with energy absorptive coating 16, is positioned on top of solder pad 14. Solder pad 14 is arranged on top of or juxtaposed relative to conductor or metallic surface 12.

Suitable metal parts which may be joined using the laser soldering process of the instant invention will generally be those required in the manufacture of electronic devices and particularly thick film products, Preferably, a first metal part 10 will consist of a metal or metallic lead and a second metal part or surface 12 which is that portion of the circuitry to which it is desirable to attach the lead. This second part will preferably be a conductor capable of conducting heat and electricity. Each electronic device may have one or more leads or conductors.

Although a wide of variety of metals and metal combinations may be utilized to produce both the lead 10 and the surface 12 to which the lead is to be attached, i.e. the conductor, preferably the lead 10 will be comprised of one or more metals selected from the Group IB and IVA metals. The Group IB metals are herein defined as copper, silver and gold. The Group IVA metals are carbon, silicon, germanium, tin and lead. Most preferably, the lead will be tin-plated copper.

The conductor or metallic surface 12 may be comprised of one or more metals selected from the group consisting of the Group VIIIB and IB metals. The Group IB metals are as described above and the Group VIIIB metals are generally the transition metals and may be defined as iron, cobalt, nickel, palladium, platinum, ruthenium, rhodium, osmium, and iridium. Most preferably the conductor will be comprised of silver. Those skilled in the art will appreciate that while the conductor 12 will most preferably be pure silver, silver alloys such as a silver/platinum/palladium alloy or a silver/palladium alloy are also suitable.

The process of the instant invention requires that the first metal part be provided with a coating 16 of an energy absorptive material. This energy absorptive coating on the first metal part 10 provides a variety of advantages. First, the energy absorptive coating acts as a protective layer which impedes the formation of metal oxides thereon. If the first metal part or lead is thoroughly cleaned of all metal oxides and the energy absorptive material is applied in an oxygen free atmosphere, the metal oxidation formation on the lead can be substantially reduced. As a result, the integrity of solder joints formed using such coated leads 10 is significantly improved. Most preferably, the oxygen free atmosphere will be nitrogen.

Suitable materials for use in the energy absorptive coating 16 will generally be those which absorb energy of the wavelength generated by the laser source. Those skilled in the art will appreciate that the choice of the material which serves as the energy absorptive coating will be dependent upon the particular wavelength of the laser utilized in the soldering process.

Several pigments having colors which evidence their energy absorbing properties have been found to be suitable for use in the instant invention. ZAPON[1] red, yellow, and blue pigments, commercially available from BASF of Wyandotte, Mich. have been found to be suitable. However, it has been found that pentaerythritol tetrabenzoate is most preferred as the energy absorptive material. As indicated in the Arbib et al. patents, disclosed above, such materials may be generally classified as esters of polyhydric alcohols. It will be appreciated by those skilled in the art that while pentaerythritol tetrabenzoate is the most preferred material, other esters of polyhydric alcohol may be used herein.

[1]ZAPON® is a registered trademark of BASF of Wyandotte, Mich.

Suitable esters will preferably have a molecular weight of at least 300 advantageously in the range from 300 to 3,000 and will be solvent at room temperature. They may be formed by the reaction of a polyhydric alcohol, for example, diethylene glycol, neopentyl glycol, glycerol, triethylene glycol, dipropylene glycol, trimethyloethane, trimethylolpropane, pentaerythritol, di-pentaerythritol, sorbitol, mannitol, inositol, or sucrose, with an organic mono- or polycarboxylic acid. Suitable acids may be chosen from saturated fatty acids, for example acetic acid or stearic acid, from unsaturated fatty acids, for example, oleic acid, or from mononuclear aromatic or cyclic carboxylic acids, for example benzoic acid, abietic acid or modified abietic acids. Esters which have been found to be particularly suitable are those derived from polyhydric alcohols containing from 2 to 8, preferably 3 to 6, hydroxyl groups, for example pentaerythritol tetraacetate, pentaerythritol tetrasterate, pentaerythritol tetraoleate, mannitol hexa-acetate, triethylene glycol dibenzoate, glyceryl tribenzoate, neopentyl glycol dibenzoate, trimethylolethane tribenzoate and sucrose octaacetate.

The advantages of the instant invention lie in the use of the energy absorptive material as a coating upon at least the first metal part of two or more metal parts to be joined in a laser soldering process. The energy absorptive material may be dissolved in a solvent or resin-like carrier to enhance the coatability of the metal part and the adherence of the energy absorptive material thereto. It will be appreciated that such materials will only be used in the minimum amount necessary to produce a coating upon the desired metal part. However, such materials should not interfere in the soldering process itself or produce undesirable residues.

The energy absorptive material may be mixed with an organic or hydroxyl containing solvent. Hydroxyl containing solvents are preferred. Examples of suitable solvents are isopropanol, 2-methyl-2, 4-pentanediol, and alpha-terpeniol.

The energy absorptive material and the organic solvent can be mixed together to produce a viscosity slightly less than that of thick paste. The end of the lead will then be dipped into the slurry or thick paste to adhere thereon. Sufficient heat may be applied to volatilize the organic solvent and to leave a coating thereon. It will be appreciated that the adherence of the energy absorptive material may be somewhat weak. However, it is believed that sufficient adherence will result to protect the underlying metal lead from metal oxide formation.

Most preferably, however, the energy absorptive coating 16 will be applied by heating the desired energy absorptive material to a temperature above its melting point to form a melt. The metal part 10 is then dipped into the resulting molten energy absorptive material. This method of applying the energy absorptive coating 16 is advantageous because the use of volatile organic solvents is completely eliminated. The act of dipping may be done manually for small laboratory or test batches, but will preferably be done mechanically for the purpose of large scale production runs. It has been found that this process produces a coating of a desirable film thickness.

One of the chief advantages of the instant invention is that the process of providing a metal lead having a coating of an energy absorptive material thereon eliminates the use of an excess amount of the energy absorptive material. As a result, the possibility of accidentally placing the energy absorptive coating upon undesired portions of the electronic device is almost negligible. The process disclosed in Arbib et al., contributes to the presence of the energy absorptive material on undesirable portions of the electronic device. The presence of the energy absorptive materials impedes and in some cases entirely prevents post soldering trimming processes.

In addition, as disclosed in Arbib et al., excess amounts of the energy absorptive material are utilized. An advantage attendant to the instant invention is that the amount of energy absorptive material used in the overall laser soldering process is kept to a minimum. Those skilled in the art will appreciate that this has significant cost advantages.

Finally, in addition to preventing formation of metal oxides on the part, the energy absorptive coating decreases the reflectivity of the first metal part and thus decreases the percentage of the laser energy which is deflected away from the components of the soldered joint. The energy absorptive material of the coating further serves to absorb the incoming laser energy and to conduct it to the underside of the first metal part and the surface of the solder.

It will be appreciated that it is within the scope of the invention that in addition to coating the first metal lead, the outer surface of a solder preform pad may also be coated as well as the outer or upper surface of the second metal part or conductor. Such coatings may be applied by dipping, spraying, or brushing the coating of the instant invention thereon. However, most preferably the coating upon the first metal lead will be sufficient.

If used, evaporation of the organic solvent may be accomplished through air drying or with the provision of low levels of heat (between 150° to 200° F.). It will be appreciated that the volatilization of organic solvents in such small amounts, particularly hydroxyl containing solvents as discussed above, do not pose a significant health hazard. Since the coating is applied only to where it is needed, lesser amounts of the organic solvent are utilized and volatilized than in prior art processes. Of course, most preferably the coating will be applied by the melt and dip method discussed above.

The instant invention may be used with preform solder pads 14 or with solder paste which is then melted to form a molten solder pad. Examples of suitable solder compositions will be those containing lead, tin and silver. If preform solder pads are not utilized, heat in the range from 180° to 320° F. must be utilized to melt the solder paste to form the solder pad. It will be appreciated that the steps of applying a solder paste and heating the solder paste to form a solder pad are the method of making the solder preform pads. The steps of applying a solder paste and heating the solder paste to a temperature sufficient to form a solder pad can be done off-site and separate from the process of laser soldering. Alternatively, said steps may be part of the process of laser soldering.

In either case, the solder pad 14 is positioned on the second metal part or conductor 12 at that location where it is desired to join the first metal part or lead 10.

When a sufficient quantity of laser energy is directed toward the coated first metal part 10 a solder joint results between the first 10 and second metal parts 12. The laser energy is absorbed by the energy absorptive coating and transferred to the solder pad 14 and the first metal part 10 as heat energy to form a soldered joint. The resultant solder joint is substantially without corrosive residues which would require post soldered cleaning.

While those skilled in art will appreciate that a variety of laser energy sources may be utilized, most preferably the laser source will be a $CO_2$ laser which generates a wavelength from 9,000 to 11,000 nanometers. When using such a laser, most preferably at least 140 W will be directed to the location of the solder joint for at least 0.1 second.

While the best modes for carrying out the invention have been described in detail, those familiar with the art to which the invention pertains will recognize alternative designs and embodiments for practicing the invention as defined by the following claims.

I claim:

1. A process of laser soldering first and second metal parts to form a solder joint, comprising:

providing a laser energy absorptive coating upon the first metal part to form a coated first metal part, wherein the coating protects against metal oxide formation on the first metal part and decreases a reflectivity thereof;

providing a solder pad on the second metal part;

juxtaposing the coated first metal part on the solder pad; and directing a quantity of laser energy to the coated first metal part so that a solder joint results between the first and the second metal parts, so that the laser energy is absorbed by the coating and transferred to the solder joint as heat energy, so that the coating imbues improved wetting and flow to the solder pad and the solder joint is substantially without corrosive residues and requires no post-solder cleaning.

2. The process of claim 1 wherein providing a solder pad further comprises:

applying a solder paste to the second metal part; and heating the solder paste to a temperature sufficient to melt the solder paste to form a molten solder paste.

3. The process of claim 1 further comprising removing substantially all metal oxides from the first metal part so as to provide a clean first metal part.

4. The process of claim 3 wherein providing an energy absorptive coating upon the first metal part includes applying a coating upon the clean first metal part in an oxygen-free atmosphere.

5. The process of claim 1 wherein the first metal part comprises a tin-plated copper lead.

6. The process of claim 1 wherein the second metal part comprises an electronic device wherein said second metal part on which said solder pad is provided comprises silver.

7. The process of claim 1 wherein providing a laser energy absorptive coating upon the first metal part comprises providing an energy absorptive coating having at least one ester derived from a polyhydric alcohol and a reagent selected from the group consisting of a saturated fatty acid, an unsaturated fatty acid, a mononuclear aromatic acid, and mixtures thereof.

8. The process of claim 7 wherein the energy absorptive coating further comprises an organic acid.

9. The process of claim 1 wherein providing an energy absorptive coating upon the first metal part comprises providing a coating of pentaerythritol tetrabenzoate.

10. The process of claim 1 wherein providing an energy absorptive coating upon the first metal part comprises providing about 99% pentaerythritol tetrabenzoate and about 1% adipic acid.

11. The process of claim 2 wherein the step of providing a solder pad further comprises:

applying a solder paste having 88% Pb, 10% Sn, and 2% Ag; and heating the solder paste to about 120°–170° C. for at least 30 minutes to form a solder pad.

12. The process of claim 1 wherein directing a quantity of laser energy comprises applying at least 140 W for at least 0.1 sec, the laser energy including a beam having a wavelength from 9000 to 11000 nm.

13. A process of laser soldering a metallic lead to an electronic device having at least one metallic surface onto which said metallic lead is to be soldered, comprising:

providing a metallic lead comprised of at least one metal selected from the group consisting of the Group IB and IVA metals, and at least one metallic surface of at least one metal selected from the group consisting of the Group VIIIB and IB metals;

providing a laser energy absorptive coating upon the metallic lead to form a coated metallic lead, wherein the coating protects against metal oxide formation on the lead and decreases reflectivity of the metallic lead;

applying a solder paste to said at least one metallic surface;

heating the solder paste to a temperature sufficient to melt the paste and allowing the melted paste to solidify, thereby forming a solder pad;

juxtaposing the coated metallic lead on the solder pad;

directing a sufficient quantity of laser energy to the coated metallic lead so that a solder joint results between said least one metallic surface and the metallic lead, wherein the laser energy is absorbed by the coating and transferred to the solder joint as heat energy, wherein the coating imbues improved wetting and flow to the solder pad and the solder joint is substantially devoid of corrosive residues and requires no post-solder cleaning.

14. The process of claim 13 wherein providing a coating comprises providing a coating having pentaerythritol tetrabenzoate.

15. The process of claim 13 wherein the coating comprises pentaerythritol tetrabenzoate and an organic acid.

16. The process of claim 15 wherein the organic acid is adipic acid.

17. A method of using an energy absorptive material in a laser soldering process, comprising:

providing first and second metal parts, the first and second metal parts each having a surface;

removing substantially all metal oxides from a surface of the first metal part so as to provide a clean first metal part;

providing a coating upon the clean first metal part to form a coated first metal part, the coating comprising a laser energy absorptive material, wherein the coating protects against metal oxide formation on a surface of the first metal part and decreases a reflectivity of the first metal part;

applying a solder paste to a surface of the second metal part;

heating the solder paste to a temperature sufficient to melt the paste and allowing said melted paste to solidify, thereby forming a solder pad;

juxtaposing the coated first metal part on the solder pad; and directing a sufficient quantity of laser energy to the coated first metal part so that a solder joint results between the first metal part and the second metal part, wherein the laser energy is absorbed by the coating and transferred to the solder joint as heat energy and the solder joint is substantially without corrosive residues and requires no post-solder cleaning.

18. The method of claim 17 wherein providing a coating upon the first metal part comprises providing a coating having at least one ester derived from a polyhydric alcohol and at least one saturated or unsaturated fatty acid or mononuclear aromatic acid.

19. The method of claim 17 wherein providing a coating upon the first metal part comprises providing a coating having an energy absorbing organic molecule.

20. The method of claim 17 wherein providing a coating upon the first metal part comprises providing a coating a comprising an energy absorbing organic molecule and an organic acid.

\* \* \* \* \*